United States Patent [19]
Schenck

[11] Patent Number: 6,072,329
[45] Date of Patent: Jun. 6, 2000

[54] METHOD AND SYSTEM OF MINIMIZING SIMULTANEOUS SWITCHING NOISE IN AN ELECTRONIC DEVICE

[75] Inventor: Stephen R. Schenck, McKinney, Tex.

[73] Assignee: Texas Instruments Incorporated, Dallas, Tex.

[21] Appl. No.: 09/212,142

[22] Filed: Dec. 15, 1998

[51] Int. Cl.[7] .................................................. H03K 17/16
[52] U.S. Cl. ................................................. 326/26; 326/82
[58] Field of Search .................................. 326/21, 22, 26, 326/82, 86, 90

[56] References Cited

U.S. PATENT DOCUMENTS

| | | |
|---|---|---|
| 4,477,904 | 10/1984 | Thorsrud .................................... 326/49 |
| 4,924,120 | 5/1990 | Schenck . |
| 4,959,563 | 9/1990 | Schenck . |
| 5,066,872 | 11/1991 | Schenck . |
| 5,118,971 | 6/1992 | Schenck . |
| 5,214,330 | 5/1993 | Okazaki ..................................... 326/82 |
| 5,220,208 | 6/1993 | Schenck . |
| 5,789,944 | 8/1998 | Choy et al. ................................ 326/82 |

*Primary Examiner*—Jon Santamauro
*Assistant Examiner*—Don Phu Le
*Attorney, Agent, or Firm*—Robert D. Marshall, Jr.; W. James Brady, III; Frederick J. Telecky, Jr.

[57] ABSTRACT

A low noise system for transmitting data includes a data bus (12) and a transmitting system (14). The data bus (12) has a plurality of data lines (20) and parity line (22). The transmitting system (14) is coupled to the data bus (12) and operable to receive a data set, store a previously adjusted data set transmitted on the data lines, generate a parity signal based on the data set and the previously adjusted data set and generate an adjusted data set based on the data and the parity signal. The adjusted data set is transmitted on the data lines (20) and the parity signal is transmitted on the parity line (22).

23 Claims, 1 Drawing Sheet

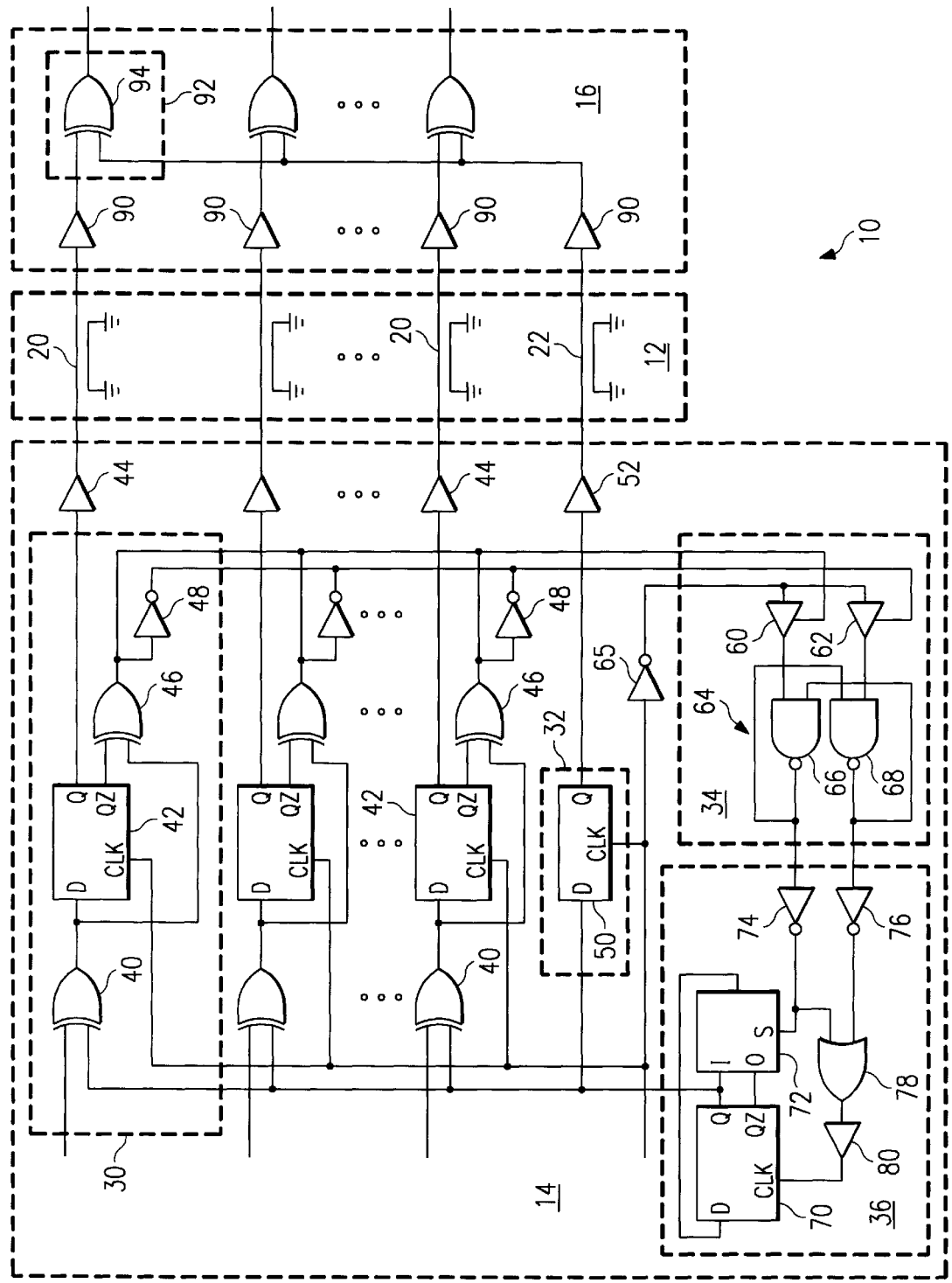

METHOD AND SYSTEM OF MINIMIZING SIMULTANEOUS SWITCHING NOISE IN AN ELECTRONIC DEVICE

RELATED APPLICATIONS

This application is related to copending U.S. application Ser. No. 09/211,907, entitled "Voting Circuit and Method" (Attorney's Docket No. TI-26733).

TECHNICAL FIELD OF THE INVENTION

This invention relates generally to the field of electronic devices, and more particularly to a method and system of minimizing simultaneous switching noise in an electronic device.

BACKGROUND OF THE INVENTION

Advancement in the integrated circuit technology has led to vast improvements in the speeds of integrated circuits. As a result, the ability to get signals off of an integrated circuit chip and on to a circuit board with as much speed as possible has become increasingly important. Increasing signal transmission speed of the integrated circuit has resulted in faster rise and fall times of the output voltages. Similarly, the fast rise and fall times of the output voltages have resulted in abrupt transitions of output current.

While faster speeds are very desirable, the abrupt transition of output currents create serious problems in the integrated circuit chip. The package holding the integrated circuit includes metallic leads that allow interconnection of the integrated circuit to devices on the circuit board. Each lead has a small inductance associated with it. The leads are connected to the integrated circuits using bonding wire which also has an associated inductance. Because of this inductance, the abrupt transition of output current creates output voltage spikes. These voltage spikes affect the voltages of the devices, cause output ringing, ground bounce, false signals and other switching noise.

To some extent, the problem may be alleviated by reducing the inductance present at the leads of the integrated circuit chip. For example, multiple power supply and ground leads may be provided in the integrated circuit chip. However, the reduction in inductance is often insufficient to eliminate voltage spikes at the output of many devices and may necessitate using a large package to carry the same integrated circuit.

SUMMARY OF THE INVENTION

Accordingly, a need has arisen in the art for a low noise system and method of communicating data in an electronic device. The present invention provides a method and system of minimizing simultaneous switching noise in an electronic device that substantially reduces or eliminates problems associated with prior switching systems and methods.

In accordance with the present invention, a low noise system for transmitting data comprises a data bus and a transmitting system. The data bus has a plurality of data lines and parity line. The transmitting system is coupled to the data bus and operable to receive a data set, store a previously adjusted data set transmitted on the data lines, generate a parity signal based on the data set and the previously adjusted data set and generate an adjusted data set based on the data set and the parity signal. The adjusted data set is transmitted on the data lines and a parity signal is transmitted on the parity line. More specifically, in accordance with one embodiment of the present invention, a receiving system may be coupled to the data bus. The receiving system is operable to receive the adjusted data set and the parity signal transmitted on the data bus and to decode the adjusted data set based on the adjusted data set and the parity signal to regenerate the data set. In this embodiment, the transmitting system may include an XOR gate associated with each data line that is operable to receive a data bit of the associated data line and the parity signal and to generate the adjusted data bit based on the data bit and the parity signal. The receiving system may include a decode XOR gate associated with each data line that is operable to receive the adjusted data bit transmitted on the data line and the parity signal transmitted on the parity line and to decode the adjusted data bit based on the adjusted data bit and the parity signal to regenerate the data bit.

Technical advantages of the present invention include providing a low noise system of communicating data in an electronic device. In particular, the transmitting system is operable to transmit data in a true or complementary state. The data may be transmitted in the true state when less than half of the data lines of a data bus need to switch from high to low or low to high. When the true state would require more than half of the data lines to switch, the data may be transmitted in the complementary state. In cases where half of the data lines need to switch for both the true and complementary states, the data may be transmitted in the previous state to prevent the parity line from switching. Thus, no more than half of the data lines need to be switched at any time to transmit data on a data bus. Accordingly, switching noise is reduced.

Another technical advantage of the present invention includes providing a low power data transmission system. In particular, the minimization of switching on the data bus reduces the power consumed to charge and discharge the data lines of the data bus. Thus, power consumption of the integrated circuit and the electronic device are reduced.

Other technical advantages of the present invention will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawing, wherein like reference numerals represent like parts, in which:

The FIGURE is a block diagram illustrating a low noise system for communicating data on a data bus in accordance with one embodiment of the present invention.

DETAILED DESCRIPTION OF THE INVENTION

The preferred embodiments of the present invention and its advantages are best understood by referring now in more detail to the FIGURE in which like numerals refer to like parts. The FIGURE illustrates a low noise system for communicating data in accordance with one embodiment of the present invention. As described in more detail below, the low noise system may include a transmitting system operable to transmit data in a true or complementary state. The data may be transmitted in the true state when less than half of the data lines of a data bus need to switch from high to low or low to high. When the true state would require more than half of the data lines to switch, the data may be transmitted in the complementary state. In cases where half of the data lines need to switch for both the true and complementary states, the data may be transmitted in the previous state to prevent the parity line from switching. Thus, no more than half of the data lines need to be switched at any time to transmit data on the data bus. Accordingly, switching noise and power to operate the data bus are reduced.

The FIGURE is a block diagram illustrating a low noise system 10 for communicating data in an electronic device. The electronic device may comprise a television, radio, computer, telephone or any other type of device that transmits and receives data on a data bus. A data bus is a set of two or more hardware lines, wires, leads, traces or other conductors on which data is transmitted between components of the device.

Referring to the FIGURE, the low noise system 10 comprises a data bus 12 connecting a transmitting system 14 to a receiving system 16. In one embodiment, the transmitting system 14 may comprise part of an integrated circuit chip and the receiving system 16 may comprise part of a printed circuit board. In this embodiment, the integrated circuit chip may plug into the printed circuit board and the data bus 12 may be partially disposed on both the integrated circuit chip and the printed circuit board. It will be understood that the data bus 12, transmitting system 14 and receiving system 16 may form part of other components of the electronic device. Thus, for example, the transmitting and receiving systems 14 and 16 may form part of separate integrated circuit chips plugged into a common printed circuit board.

The data bus 12 comprises a plurality of data lines 20 and a parity line 22. The data and parity lines 20 and 22 may be conventionally grounded to allow each line to be switched as necessary from low to high or high to low. As described in more detail below, true or complementary data may be transmitted on the data lines 20 along with a parity signal on the parity line 22 identifying the true or complementary state of the transmitted data. As a result, no more than half of the data lines need to be switched from a previous state at any time to transmit data on the data bus.

In one embodiment, the data bus 12 may be an eight (8) bit bus. In this embodiment, the data bus 12 may comprise eight (8) data lines 20 in addition to the parity line 22. It will be understood that the data bus 12 may be otherwise sized without departing from the scope of the present invention. For example, the data bus may be a 16 bit bus, a 32 bit bus and the like.

The transmitting system 14 comprises a data line system 30 associated with each data line 20, a parity line system 32 associated with the parity line 22, a parity voting system 34 connected to the data line systems 30 and a parity latch system 36 connected to the parity voting system 34, the data line systems 30 and the parity line system 32. It will be understood that the components of the transmitting system 14 may be otherwise suitably combined or divided into these or other systems without departing from the scope of the present invention. Accordingly, the labels of data line system, parity line system, parity voting system and parity latch system are for illustrative purposes and may be varied without departing from the scope of the present invention.

The transmitting system 14 receives data sets to be transmitted on the data bus 12. The data sets may be received from a memory such as a DRAM, ROM and the like. The data sets include a plurality of data bits each associated with one of the data lines 20. A data bit is associated with a data line 20 in that the data bit will be transmitted on the data line 20 in a true or complementary state.

In the transmitting system 14, each data bit is received by the data line system 30 of the associated data line 20. In one embodiment, the data line system 30 comprises an adjustment exclusive-or (XOR) gate 40, data flip-flop 42, output driver 44, comparison exclusive-or (XOR) gate 46 and an inverter 48. In this embodiment, the adjustment XOR gate 40 receives the data bit. The adjustment XOR gate 40 also receives a parity signal and generates an adjusted data bit based on the data bit and parity signal. As described in more detail below, the parity signals are generated by the parity latch system 36. The parity signals may be true or complementary. A true value of the parity signal means that the data bits will be transmitted in the state in which they are received. Thus a logic zero (low) will be transmitted as a logic zero and a logic one (high) will be transmitted as a logic one. A complementary value of the parity signal means that the data bits will be transmitted in the opposite state from that in which they are received. Thus, a logic zero will be transmitted as a logic one and a logic one will be transmitted as a logic zero.

For the embodiment of the FIGURE, the parity signals generated by the parity latch system 36 are a logic zero when true and a logic one when complementary. Accordingly, when the parity signal is a logic zero, a logic one data bit will have a logic one adjusted data bit and a logic zero data bit will have a logic zero adjusted data bit. When the parity signal has a logic one value, a logic one data bit will have a logic zero adjusted data bit and a logic zero data bit will have a logic one adjusted data bit. Thus, when the parity signal is complementary, the adjustment XOR gate 40 changes the state of the data bit from logic one to logic zero or from logic zero to logic one.

The data flip-flop 42 receives the adjusted data bit generated by the adjustment XOR gate 40 at input (D) and a clock signal (CLK). In response to the clock signal, the data flip-flop 42 latches the adjusted data bit at output (Q) for transmission on the data line 20. In one embodiment, the data flip-flop 42 is a rising edge triggered flip-flop. In this embodiment, the adjusted data bit is latched at output (Q) in response to the rising edge of the clock signal. It will be understood that the adjusted data bit may be otherwise latched or stored by suitable means without departing from the scope of the present invention.

The adjusted data bit latched at output (Q) of the data flip-flop 42 is received by the output driver 44 and transmitted on the data line 20. Transmission of the adjusted data bit is simultaneous with transmission of the adjusted data bits of the other data lines 20 and the parity signal used to adjust the adjusted data bits. The parity signal is transmitted on the parity line 22. As described in more detail below, the parity signal is used by the receiving system 16 to decode the adjusted data bits to regenerate the data bits.

The data flip-flop 42 latches an inverse of the adjusted data bit at output (QZ) as a stored previously adjusted data bit. As described in more detail below, the stored previously adjusted data bit is used to determine a parity signal for a subsequent data set. The term previously adjusted data bit means information establishing the previously adjusted data bit. That information may be the data itself, an inverse of the data or other suitable information. Thus, the terms data or signal as used herein mean information establishing the data or signal.

Subsequent data sets are received by the transmitting system 14 after the adjusted data bits of the previous data set are latched by the data flip-flop 42. Thus, receipt of a subsequent data set will not interfere with transmission or storage of the previous data set. For the rising edge triggered flip-flop 42, the subsequent data set is preferably received immediately following the rising edge of the clock signal that latches the previous data set. This allows a maximum amount of time to determine the parity signal and adjust the data bit of the subsequent data set before they are latched by the rising edge triggered flip-flop 42. It will be understood that receipt of subsequent data sets may be otherwise suitably clocked without departing from the scope of the present invention.

The subsequent data set includes a plurality of data bits each received in an associated data line system 30 by the adjustment XOR gate 40 as previously described. The adjustment XOR gate 40 continues to receive the parity signal, which is a previous parity signal to the subsequent data set. Based on the data bit and the previous parity signal, the adjustment XOR gate 40 generates a signal used by the comparison XOR gate 46. The comparison XOR gate 46 compares the signal to the stored previously adjusted data bit and generates a comparison signal. The comparison signal represents whether the parity signal should be switched to prevent the data line 20 from switching. For the embodiment of the FIGURE, the comparison signal is a logic zero when the parity signal should be switched and a logic one when the parity signal should not be switched.

The inverter 48 receives the comparison signal and generates an inverted comparison signal. Thus, the inverted comparison signal also represents whether the parity signal should be switched to prevent the data line 20 from switching. The inverted comparison signal is a logic one when the parity signal should be switched and a logic zero when the parity signal should not be switched. As described in more detail below, the comparison signal and the inverted comparison signal generated by each of the line systems 30 are used by the parity voting system 34 and the parity latch system 36 to generate the parity signal for transmitting the subsequent data set. In particular, the parity signal is used by the adjustment XOR gates 40 to adjust the data bits of the subsequent data set. The parity signal is also transmitted with the adjusted data bits to allow the receiving system to decode the adjusted data bits and regenerate the data bits of the subsequent data set.

The parity line system 32 comprises a parity flip-flop 50 and an output driver 52. The parity flip-flop 50 receives the parity signal at input (D) and the clock signal (CLK). In response to the clock signal, the parity flip-flop 50 latches the parity signal at output (Q) for transmission on the parity line 22. In one embodiment, the parity flip-flop 50 is a rising edge triggered flip-flop. In this embodiment, the parity signal is latched at output (Q) in response to the rising edge of the clock signal. It will be understood that the parity signal may be otherwise suitably latched or stored without departing from the scope of the present invention.

The parity signal latched at output (Q) of the parity flip-flop 50 is received by the output driver 52 and transmitted on the parity line 22. Transmission of the parity signal is simultaneous with transmission of the adjusted data bits on the data lines 20. As described in more detail below, the parity signal is used by the receiving system 16 to decode the adjusted data bits transmitted on the data bus 12.

The parity voting system 34 comprises a first variable delay 60, a second variable delay 62 and a voting latch 64. The first and second variable delays 60 and 62 operate on a voting clock signal. For the embodiment of the FIGURE, the voting clock signal is generated by an inverter 65 connected to the clock signal used by the data flip-flops 42. Thus, the voting clock signal is the inverse of the clock signal. It will be understood that the first and second variable delays 60 and 62 may be otherwise suitably clocked without departing from the scope of the present invention.

The first variable delay 60 is connected to the comparison XOR gates 46 to receive the comparison signals. The first variable delay 60 determines a first delay based on the comparison signals and generates a first delay output in response to the first delay of the voting clock signal. For the embodiment of the FIGURE, the first variable delay 60 delays the voting clock signal by one increment for each logic low comparison signal.

The second variable delay 62 is connected to the invertors 48 to receive the inverted comparison signals. The second variable delay 62 determines a second delay based on the inverted comparison signals and generates a second delay output in response to the second delay of the voting clock signal. For the embodiment of the FIGURE, the second variable delay 62 delays the variable clock signal by one increment for each logic low inverted comparison signal. Thus, both the first and second variable delays 60 and 62 delay the voting clock signal one increment for each logic low input sinal.

As previously described, the comparison signal generated by each line system 30 is a logic zero when the parity signal should be switched. Thus, each comparison signal that is a logic one is a vote for the parity signal to not switch and each logic zero comparison signal is a vote for the parity signal to switch. The inverted comparison signals are the inverse of the comparison signals. As a result, the inverted comparison signal is a logic zero when the parity signal should not be switched. Thus, each comparison signal that is a logic zero is a vote for the parity signal to not switch and each logic one comparison signal is a vote for the parity signal to switch.

Because the comparison signals and inverted comparison signals are the inverse of each other, the number of logic one comparison signals is equal to the number of logic zero inverted comparison signals and the number of logic zero comparison signals is equal to the number of logic one inverted comparison signals. As previously described, both the first and second variable delays 60 and 62 delay the voting clock signal by one increment for each logic low input signal. Thus, if a majority of the comparison signals are logic ones, which is a vote to not switch the parity signal, the first variable delay 60 will delay the voting clock signal for a shorter period of time than the second variable delay because the majority of the inverted comparison signals will be logic zeros. Accordingly, generation of the first delayed output by the first variable delay 60 prior to generation of the second delayed output by the second variable delay 62 indicates that the parity signal will not be switched. If the majority of the comparison signals are logic zeros, which is a vote to switch the parity signal, the first variable delay 60 will delay the voting clock signal for a longer period of time than the second variable delay 62 because of the majority of the inverted comparison signals will be logic ones. Accordingly, generation of the second delayed output by the second variable delay 62 prior to generation of the first delayed output by the first variable delay 60 indicates that the parity signal will be switched.

For an embodiment in which the data bus 12 has an even number of data lines 20, one of the variable delays 60 or 62 may include a supplemental delay to prevent the first and second delays from being substantially equal. For the embodiment of the FIGURE, the second variable delay 62 includes a supplemental delay having the value of one-half of the delay increment of a logic low input signal. Thus, if an equal number of comparison signals and inverted comparison signals are logic ones and zeros, the supplemental delay will extend the second delay and allow the first variable delay 60 to generate the first delayed output before the second variable delay 62 generates the second delayed output. As a result, when the comparison signals and inverted comparison signals have an equal number of logic ones and zeros, the parity signal will not switch.

The voting latch 64 is connected to the first and second variable delays 60 and 62 and is operable to generate a latch voting output in response to the first and the second delayed outputs. In one embodiment, the voting latch 64 comprises a first NAND gate 66 and a second NAND gate 68. The first NAND gate 66 is connected to the first variable delay 60 and the second NAND gate 68. The first NAND gate 66 receives the first delayed output generated by the first variable delay 60 and a second NAND output generated by the second NAND gate 68 and generates a first NAND output. The second NAND gate 68 is connected to the second variable delay 62 and the first NAND gate 66. The second NAND gate 68 receives the second delayed output and the first NAND output generated by the first NAND gate 66 and generates the second NAND output.

The first and second NAND outputs are both initially a logic one. In response to the first NAND gate 66 receiving the first delayed output prior to the second NAND gate 68 receiving the second delayed output, the first NAND output goes to a logic zero and latches the second NAND output at a logic one. Thus, even when the second NAND gate 68 receives the second output signal, the second NAND output will remain at a logic one. For the embodiment of the FIGURE, when the first NAND output is a logic zero and the second NAND output is a logic one, the parity signal will not switch. In response to the second NAND gate 68 receiving the second delayed output prior to the first NAND gate 66 receiving the first delayed output, the second NAND output goes a logic zero and latches the first NAND output at a logic one. Thus, even when the first NAND gate 66 receives the first output signal, the first NAND output will remain at a logic one. For the embodiment of the FIGURE, when the first NAND output is a logic one and the second NAND output is a logic zero, the parity signal will switch. Either the first NAND output or the second NAND output may be used as a latched voting output from which the parity signal is generated.

Accordingly, the data line systems 30 each vote on whether the parity signal should switch. The parity voting system 34 receives and tabulates the votes to determine if the parity signal will switch. In accordance with one aspect of the invention, the parity voting system 34 is a voting circuit that efficiently determines and latches the voting output with minimal components. In particular, the voting circuit need only include a pair of variable delays and NAND gates. Accordingly, expensive software or complex logic structures comprising numerous gates need not be used. As a result, manufacturing costs are reduced and speed of data transmission is increased. It will be understood that the voting circuit of the present invention may be used in other suitable applications.

The parity latch system 36 is connected to the parity voting system 34 to receive the latched voting output. As described in more detail below, the parity latch system 36 generates the parity signal based on the latched voting output. In one embodiment, the parity latch system 36 comprises a parity latch flip-flop 70 and a multiplexer 72. In this embodiment, the parity signal is generated by the multiplexer 72 and latched by the parity latch flip-flop 70. It will be understood that the parity signal may be otherwise suitably generated, latched or stored without departing from the scope of the present invention.

The parity latch flip-flop 70 receives the parity signal generated by the multiplexer 72 at input (D) and a parity latch clock signal (CLK). In response to the parity latch clock signal, the parity latch flip-flop 70 latches the parity signal at output (Q) for use by the data and parity line systems 30 and 32 and the inverse of the parity signal at inverse output (QZ).

The multiplexer 72 receives the output (Q) of the parity latch flip-flop 70 as a first input, the inverse output (QZ) of the parity latch flip-flop 70 as a second input and the latched voting output as a select input (S). In response to the select input, the multiplexer 72 selects one of the first and second inputs as the parity signal. For the embodiment of the FIGURE, the latched voting output is the first NAND output. The first NAND output is connected to the multiplexer 72 through a first inverter 74. In this embodiment and as previously described, the parity signal is a logic zero when true data is to be transmitted and a logic one when complementary data is to be transmitted.

In one embodiment, the parity latch system 36 comprises a second inverter 76, an OR gate 78 and a buffer 80 to generate the parity latch clock signal based on the first and second NAND outputs. In this embodiment, the second inverter 76 inverts the second NAND output. The OR gate is connected to the first and second inverters 74 and 76 to receive the first inverted NAND output and the second inverted output. The OR gate 78 generates the parity latch clock signal based on the inverted first and second NAND outputs. The buffer 80 is connected between the OR gate 78 and the parity latch flip-flop 70 to delay the parity latch clock signal to allow the multiplexer 72 to receive the latched voting output and to select one of the output and the inverse output of the parity latch flip-flop 70 as the parity signal in response to the latched voting output and the parity latch flip-flop 70 to receive the parity signal prior to receiving the parity latch clock signal. It will be understood that the parity latch system 36 may be otherwise suitably clocked without departing from the scope of the present invention.

As previously described, the parity signal is received by the XOR gate 40 and used to generate the adjusted data bits of the subsequent data set. The adjusted data bits are received by the data flip-flops 42 and latched at output (Q) for transmission on the data lines 20. Each data flip-flop 42 also latches an inverse of the adjusted data bits at output (QZ) as the stored previously adjusted data bit for a next subsequent data set. The output drivers 44 transmit the adjusted data bits to the receiving system 16 on the data lines 20.

The receiving system 16 comprises an input driver 90 connected to each of the data lines 20 and to the parity line 22. The input drivers 90 receive the adjusted data bits and the parity signal and pass an adjusted data bit and the parity signal to a decode system 92 associated with each data line 20. It will be understood that the receiving system 16 may otherwise suitably receive the adjusted data bits and the parity signal without departing from the scope of the present invention.

In one embodiment, the decode system 92 comprises a decode exclusive-or (XOR) gate 94. In this embodiment, the decode XOR gate 94 receives the adjusted data bit of the associated data line 20 and the parity signal and decodes the adjusted data bit based on the adjusted data bit and the parity signal to regenerate the data bit of the data line 20. For a true parity signal, a logic zero adjusted data bit is decoded to a logic zero data bit and a logic one adjusted data bit is decoded to a logic one data bit. Conversely, for a complementary parity signal, a logic zero adjusted data bit is decoded to a logic one data bit and a logic one adjusted data bit is decoded to a logic zero data bit. Thus, data is be transmitted in the true state when less than half of the data lines of a data bus need to switch from high to low or low to high. When the true state would require more than half of the data lines to switch, the data may be transmitted in the complementary state. In cases where half of the data lines need to switch for both the true and complementary states, the data may be transmitted in the previous state to prevent the parity line from switching. As a result, no more than half of the data lines need to be switched at any time to transmit data on the data bus. Accordingly, switching noise and power to operate the data bus are reduced.

Although the present invention has been described with several embodiments, various changes and modifications may be suggested to one skilled in the art. It is intended that the present invention encompass such changes and modifications as fall within the scope of the appended claims.

What is claimed is:

1. A low noise system for transmitting data, comprising:
   a data bus having a plurality of data lines and a parity line;
   a transmitting system coupled to the data lines and the parity line; and
   the transmitting system operable to receive a data set, store a previously adjusted data set transmitted on the data lines, generate a parity signal based on the data set and the previously adjusted data set, generate an adjusted data set based on the data set and the parity signal, transmit the adjusted data set on the data lines and transmit the parity signal on the parity line.

2. The system of claim 1, the transmitting system further operable to store a previous parity signal and to generate the parity signal based on the data set, the previously adjusted data set and the previous parity signal.

3. The system of claim 1, the transmitting system further comprising an adjustment XOR gate associated with each of the data lines, each of the adjustment XOR gates operable to receive a data bit of the associated data line and the parity signal and to generate an adjusted data bit based on the data bit and the parity signal.

4. The system of claim 3, the transmitting system further comprising a data flip-flop associated with each of the data lines, each of the data flip-flops operable to receive an adjusted data bit of the associated data line and to latch the adjusted data bit in response to a clock signal for transmission on the data line.

5. The system of claim 4, the transmitting system further comprising a parity flip-flop associated with the parity line, the parity data flip-flop operable to receive the parity signal and to latch the parity signal in response to a clock signal for transmission on the parity line.

6. The system of claim 1, wherein the stored previously adjusted data set comprise an inverse of the previously adjusted data set transmitted on the data lines.

7. The system of claim 1, the transmitting system further comprising:
   a comparison XOR gate associated with each of the data lines, each of the comparison XOR gates operable to receive a signal based on a data bit and on a previously adjusted data bit of the associated data line and to generate a comparison signal based on the signal and the previously adjusted data bit; and
   the transmitting system operable to generate the parity signal based on the comparison signals.

8. The system of claim 7, wherein the signal is based on the data bit and a previous parity signal.

9. The system of claim 8, the transmitting system further comprising a second XOR gate associated with each of the data lines, each of the second XOR gates operable to receive the data bit of the associated data line and the previous parity signal and to generate the signal based on the data bit and the previous parity signal.

10. The system of claim 9, the second XOR gate being an adjustment XOR gate, the adjustment XOR gate further operable to receive the parity signal and to generate an adjusted data bit based on the data bit and the parity signal.

11. The system of claim 7, the transmitting system further comprising:
    an inverter associated with each of the comparison XOR gates, each of the invertors operable to receive the comparison signal of the associated comparison XOR gate and to generate an inverted comparison signal; and
    the transmitting system operable to generate the parity signal based on the comparison signals and the inverted comparison signals.

12. The system of claim 11, the transmitting system further comprising:
    a voting system comprising:
       a first variable delay connected to the comparison XOR gates, the first variable delay operable to receive the comparison signals and a voting clock signal, determine a first delay based on the comparison signals and generate a first delayed output in response to the first delay of the voting clock signal;
       a second variable delay connected to the invertors, the second variable delay operable to receive the inverted comparison signals and the voting clock signal, determine a second delay based on the inverted comparison signals and generate a second delayed output in response to the second delay of the voting clock signal;
       a voting latch connected to the first and second variable delays, the voting latch operable to receive the first and second delayed outputs and to generate a latched voting output in response to the first and second delayed outputs; and
    the transmitting system operable to generate the parity signal based on the latched voting output.

13. The system of claim 12, further comprising:
    the data bus having an even number of data lines; and
    one of variable delays further comprising a supplemental delay operable to prevent the first and second delays from being substantially equal.

14. The system of claim 12, the voting latch further comprising:
    a first NAND gate connected to the first variable delay, the first NAND gate operable to receive the first delayed output and a second NAND output of a second NAND gate and to generate a first NAND output;
    the second NAND gate connected to the second variable delay, the second NAND gate operable to receive the second delayed output and the first NAND output of the first NAND gate and to generate the second NAND output;
    the first NAND output comprising a first parity switch value in response to the first NAND gate receiving the first delayed output prior to the second NAND gate receiving the second delayed output and comprising a second parity switch value in response to the second NAND gate receiving the second delayed output prior to the first NAND gate receiving the first delayed output;

the second NAND output comprising a third parity switch value corresponding to the second parity switch value in response to the second NAND gate receiving the second delayed output prior to the first NAND gate receiving the first delayed output and comprising a fourth parity switch value corresponding to the first parity switch value in response to the first NAND gate receiving the first delayed output prior to the second NAND gate receiving the second delayed output; and one of the first and second NAND outputs comprising the latched voting output.

15. The system of claim 12, the transmitting system further comprising a parity latch system connected to the voting system, the parity latch system comprising:

a parity latch flip-flop operable to receive the parity signal from a multiplexer and to latch the parity signal in response to a parity latch clock signal; and the multiplexer operable to receive an output and an inverse output of the parity latch flip-flop, select the output as the parity signal in response to a first value of the latched voting output and select the inverse output as the parity signal in response to a second value of the latched voting output.

16. The system of claim 15, the parity latch clock signal comprising a function of the latched voting output and a delay operable to allow the multiplexer to receive the latched voting output and to select one of the output and the inverse output of the parity latch flip-flop as the parity signal in response to the latched voting output and the parity latch flip-flop to receive the parity signal prior to receiving the parity latch clock signal.

17. The system of claim 14, the transmitting system further comprising a parity latch system connected to the voting system, the parity latch system comprising:

a parity latch flip-flop operable to receive the parity signal from a multiplexer and to latch the parity signal in response to a parity latch clock signal;

the multiplexer operable to receive an output and an inverse output of the parity latch flip-flop, select the output as the parity signal in response to a first value of the latched voting output and select the inverse output as the parity signal in response to a second value of the latched voting output;

an OR gate connected to a first inverter and a second inverter, the first inverter connected to the first NAND gate and operable to receive the first NAND output and generate an first inverted NAND output and the second inverter connected to the second NAND gate and operable to receive the second NAND output and generate a second inverted NAND output, the OR gate operable to receive the first and second inverted NAND outputs and generate the parity latch clock signal; and a buffer connected between the OR gate and the parity latch flip-flop, the buffer operable to receive the parity latch clock signal and to delay the parity latch clock signal to allow the multiplexer to receive the latched voting output and to select one of the output and the inverse output of the parity latch flip-flop as the parity signal in response to the latched voting output and the parity latch flip-flop to receive the parity signal prior to receiving the parity latch clock signal.

18. The system of claim 17, the transmitting system further comprising:

an adjustment XOR gate associated with each of the data lines, each of the adjustment XOR gates operable to receive a data bit of the associated data line and the parity signal and to generate an adjusted data bit based on the data bit and the parity signal;

a data flip-flop associated with each of the data lines, each of the data flip-flops operable to receive an adjusted data bit of the associated data line and to latch the adjusted data bit in response to a clock signal for transmission on the data line;

a parity flip-flop associated with the parity line, the parity data flip-flop operable to receive the parity signal and to latch the parity signal in response to the clock signal for transmission on the parity line; and wherein the voting clock signal comprises an inverse of the clock signal.

19. A low noise system for communicating data, comprising:

a data bus having a plurality of data lines and a parity line;

a transmitting system and a receiving system coupled to the data lines and the parity line;

the transmitting system operable to receive a data set, store a previously adjusted data set transmitted on the data lines, generate a parity signal based on the data set and the previously adjusted data set, generate an adjusted data set based on the data set and the parity signal, transmit the adjusted data set on the data lines and transmit the parity signal on the parity line; and the receiving system operable to receive the adjusted data set and the parity signal transmitted on the data bus and to decode the adjusted data set based on the adjusted data set and the parity signal to regenerate the data set.

20. The system of claim 19, further comprising:

the transmitting system comprising an adjustment XOR gate associated with each of the data lines, each of the adjustment XOR gates operable to receive a data bit of the associated data line and the parity signal and to generate an adjusted data bit based on the data bit and the parity signal; and the receiving system comprising a decode XOR gate associated with each of the data lines, each of the decode XOR gates operable to receive an adjusted data bit transmitted on the data line and the parity signal transmitted on the parity line and to decode the adjusted data bit based on the adjusted data bit and the parity signal to regenerate the data bit.

21. A low noise method of communicating data, comprising the steps of:

receiving a data set comprising a plurality of data bits each associated with a data line;

storing a previously adjusted data set comprising a plurality of previously adjusted data bits each transmitted on one of the data lines;

generating a parity signal based on the data set and the previous adjusted data set;

generating an adjusted data set based on the data set and the parity signal, the adjusted data set comprising a plurality of adjusted data bits each associated with one of the data lines;

transmitting the adjusted data set on the data lines; and transmitting the parity signal on a parity line.

22. The method of claim 21, further comprising the step of storing a previous parity signal, wherein the parity signal is based on the data set, the previous adjusted data set and the previous parity signal.

23. The method of claim 21, further comprising the steps of:

receiving the adjusted data set transmitted on the data lines;

receiving the parity signal transmitted on the parity line; and decoding the adjusted data set based on the adjusted data set and the parity signal to regenerate the data set.

* * * * *

UNITED STATES PATENT AND TRADEMARK OFFICE
CERTIFICATE OF CORRECTION

PATENT NO: 6,072,329

DATED: 6/6/00

INVENTOR(S): Stephen R. Schenck

It is certified that error appears in the above-identified patent and that said Letters Patent are hereby corrected as shown below:

Cover Page, insert Item [60] under Related U.S. Application Data

--Provisional Application No. 60/068,581  December 23, 1997.--

Signed and Sealed this

Eighth Day of May, 2001

Attest:

NICHOLAS P. GODICI

Attesting Officer

Acting Director of the United States Patent and Trademark Office